United States Patent
Yang et al.

(10) Patent No.: US 9,425,104 B2
(45) Date of Patent: Aug. 23, 2016

(54) COMPLEMENTARY METAL OXIDE SEMICONDUCTOR DEVICE AND METHOD OF MANUFACTURING THE SAME

(71) Applicants: Moon-seung Yang, Hwaseong-si (KR); Mohammad Rakib Uddin, Hwaseong-si (KR); Myoung-jae Lee, Hwaseong-si (KR); Sang-moon Lee, Yongin-si (KR); Sung-hun Lee, Yongin-si (KR); Seong-ho Cho, Gwacheon-si (KR)

(72) Inventors: Moon-seung Yang, Hwaseong-si (KR); Mohammad Rakib Uddin, Hwaseong-si (KR); Myoung-jae Lee, Hwaseong-si (KR); Sang-moon Lee, Yongin-si (KR); Sung-hun Lee, Yongin-si (KR); Seong-ho Cho, Gwacheon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 38 days.

(21) Appl. No.: 14/259,569

(22) Filed: Apr. 23, 2014

(65) Prior Publication Data

US 2015/0069517 A1   Mar. 12, 2015

(30) Foreign Application Priority Data

Sep. 6, 2013   (KR) .................. 10-2013-0107502

(51) Int. Cl.
| | |
|---|---|
| H01L 21/70 | (2006.01) |
| H01L 21/8238 | (2006.01) |
| H01L 21/8252 | (2006.01) |
| H01L 21/8258 | (2006.01) |
| H01L 27/06 | (2006.01) |
| H01L 27/092 | (2006.01) |

(52) U.S. Cl.
CPC ....... *H01L 21/8238* (2013.01); *H01L 21/8252* (2013.01); *H01L 21/8258* (2013.01); *H01L 27/0605* (2013.01); *H01L 27/092* (2013.01)

(58) Field of Classification Search
None
See application file for complete search history.

(56) References Cited

U.S. PATENT DOCUMENTS

| | | | |
|---|---|---|---|
| 7,525,164 B2 * | 4/2009 | Forbes | ............. H01L 21/26506 257/295 |
| 9,006,707 B2 * | 4/2015 | Hudait | .................. B82Y 10/00 257/14 |
| 2004/0012037 A1 | 1/2004 | Venkatesan et al. | |
| 2008/0197420 A1 | 8/2008 | Yeh et al. | |
| 2009/0095981 A1 | 4/2009 | Kang et al. | |
| 2013/0052813 A1 | 2/2013 | Yeh et al. | |
| 2013/0062696 A1 * | 3/2013 | Di | .......................... H01L 21/84 257/351 |
| 2013/0105859 A1 * | 5/2013 | Wang | ...................... H01L 29/78 257/190 |
| 2013/0137238 A1 | 5/2013 | Nieh et al. | |
| 2013/0146976 A1 * | 6/2013 | Flachowsky | .... H01L 21/823412 257/351 |

(Continued)

FOREIGN PATENT DOCUMENTS

| | | |
|---|---|---|
| CN | 103 390 591 A | 11/2013 |
| EP | 1 089 338 A2 | 4/2001 |
| EP | 2 333 827 A2 | 6/2011 |

(Continued)

OTHER PUBLICATIONS

European Search Report mailed on Jul. 10, 2015.

*Primary Examiner* — Ali Naraghi
(74) *Attorney, Agent, or Firm* — Harness, Dickey & Pierce, P.L.C.

(57) ABSTRACT

Provided are a complementary metal oxide semiconductor (CMOS) device and a method of manufacturing the same. In the CMOS device, a buffer layer is disposed on a silicon substrate, and a first layer including a group III-V material is disposed on the buffer layer. A second layer including a group IV material is disposed on the buffer layer or the silicon substrate while being spaced apart from the first layer.

17 Claims, 10 Drawing Sheets

(56) References Cited

U.S. PATENT DOCUMENTS

| | | |
|---|---|---|
| 2013/0264609 A1 | 10/2013 | Di et al. |
| 2015/0024601 A1 | 1/2015 | Zhou et al. |

FOREIGN PATENT DOCUMENTS

| | | |
|---|---|---|
| KR | 2007-0028311 A | 3/2007 |
| KR | 2007-0086303 A | 8/2007 |
| KR | 10-0843229 B1 | 7/2008 |
| KR | 2008-0076915 A | 8/2008 |
| KR | 2010-0078548 A | 7/2010 |
| KR | 10-1020841 B1 | 3/2011 |
| KR | 20110050621 A | 5/2011 |
| KR | 10-1167530 B1 | 7/2012 |
| KR | 2012-0120379 A | 11/2012 |
| WO | WO-2012/155831 A1 | 11/2012 |

* cited by examiner

COMPLEMENTARY METAL OXIDE SEMICONDUCTOR DEVICE AND METHOD OF MANUFACTURING THE SAME

CROSS-REFERENCE TO RELATED APPLICATIONS

This application claims priority from Korean Patent Application No. 10-2013-0107502, filed on Sep. 6, 2013, in the Korean Intellectual Property Office, the disclosure of which is incorporated herein in its entirety by reference.

BACKGROUND

1. Field

The present disclosure relates to complementary metal oxide semiconductor (CMOS) devices and/or methods of manufacturing the same, and more particularly, to CMOS devices including both an n-type transistor layer and a p-type transistor layer on a silicon substrate and/or methods of manufacturing the same.

2. Description of the Related Art

Extensive research has been conducted to develop devices that use compound semiconductors, for example, Group III-V semiconductor materials. Since the electron mobility of Group III-V compound semiconductor materials is higher by about 10 times to about $10^3$ times than the electron mobility of silicon (Si), the Group III-V compound semiconductor materials are used for high-speed channels in complementary metal oxide semiconductor (CMOS) devices or are suitably applied to high-efficiency Group III-V solar cells.

Group III-V substrates formed of materials, such as InP, GaAs, GaSb, and InSb, have been widely used as substrates for growing Group III-V semiconductor materials. However, the Group III-V substrates are more expensive and more likely to be damaged during a process than Si substrates. Also, the maximum size of commercial substrates is about 6 inches, and the Group III-V substrates are difficult to manufacture in large sizes. In order to overcome these problems, semiconductor devices using Si substrates instead of Group III-V substrates have been developed.

Recently, interest in the technology for implementing silicon-based photonics integrated circuits has increased. In line with this trend, demand for the technology using Group III-V compound semiconductor materials to form light sources, such as light emitting diodes (LEDs) and laser diodes (LDs), and transistors for high-speed devices on Si substrates has increased. When a Group III-V compound semiconductor is integrated on a large-sized Si substrate, the known silicon manufacturing processes may be used without modification, and the costs thereof may be greatly reduced.

However, various defects are generated due to the lattice constant difference and the thermal expansion coefficient difference between a Group III-V compound semiconductor material and an Si substrate, and the application of a compound Group III-V semiconductor material to devices is restricted due to these defects. For example, when a semiconductor thin film having a smaller lattice constant than a substrate is grown, a dislocation may occur due to a compressive stress; and when a semiconductor thin film having a larger lattice constant than a substrate is grown, a crack may be generated due to a tensile stress.

SUMMARY

At least one example embodiment includes complementary metal oxide semiconductor (CMOS) devices including both an n-type transistor layer and a p-type transistor layer on a silicon substrate.

At least one example embodiment includes methods of manufacturing CMOS devices including both an n-type transistor layer and a p-type transistor layer on a silicon substrate.

Additional example embodiments will be set forth in part in the description which follows and, in part, will be apparent from the description, or may be learned by practice of the presented embodiments.

According to an example embodiment, a method of manufacturing a complementary metal oxide semiconductor (CMOS) device includes forming a buffer layer on a silicon substrate; forming a material layer for an n-type transistor on the buffer layer; etching the material layer for the n-type transistor to form a first layer for the n-type transistor and a first pattern; forming an insulating layer on the first layer and the first pattern; etching the insulating layer to form a second pattern for selective growth; and selectively growing a second layer for a p-type transistor in the second pattern.

The buffer layer may include or, alternatively, be formed of a Group III-V material including at least one selected from the group consisting of indium (In), gallium (Ga), and aluminum (Al), and at least one selected from the group consisting of arsenic (As), phosphorus (P), and stibium (antimony) (Sb).

The buffer layer may include or, alternatively, be formed of at least one selected from the group consisting of InP, InAs, InSb, GaAs, GaP, GaSb, AlP, AlAs, AlSb, InAlAs, InGaP, GaAsP, InGaAsP, and InGaAlAs.

The buffer layer may be doped with an n-type dopant.

The buffer layer may include at least one Group IV material.

The buffer layer may include or, alternatively, be formed of at least one of SiGe, GeSn, and germanium (Ge).

The first layer may include or, alternatively, be formed of a Group III-V material.

The first layer may include or, alternatively, be formed of at least one of InGaAs, InP, InSb, InGaSb, GaSb, and InAs.

The second layer may include or, alternatively, be formed of a Group IV material.

The second layer may include or, alternatively, be formed of Ge.

The n-type transistor may include an n-type metal oxide semiconductor field effect transistor (MOSFET).

The p-type transistor may include a p-type MOSFET.

The first layer and the second layer may be channel layers.

In the forming of the first pattern, the material layer may be etched to expose a portion of the buffer layer.

In the forming of the first pattern, the material layer may be etched to expose the silicon substrate.

The insulating layer may include or, alternatively, be formed of a silicon oxide film, a silicon nitride film, or a silicon oxynitride film.

According to another example embodiment, a CMOS device includes a silicon substrate; a buffer layer on the silicon substrate; a first layer for an n-type transistor on the buffer layer; a second layer for a p-type transistor disposed on the buffer layer or the silicon substrate while being spaced apart from the first layer; and an insulating layer between the first layer and the second layer.

At least one example embodiment includes a method of manufacturing a complementary metal oxide semiconductor (CMOS) device that includes forming a buffer layer on a substrate, forming a first material layer on the buffer layer, the first material layer including a group III-V material, etching the first material layer to form a first layer and a first pattern, forming an insulating layer on the first layer and the first pattern, etching the insulating layer to form a second pattern, and selectively growing a second material layer in the second pattern, the second material layer including a group IV material.

BRIEF DESCRIPTION OF THE DRAWINGS

These and/or other example embodiments will become apparent and more readily appreciated from the following description of the embodiments, taken in conjunction with the accompanying drawings in which.

DETAILED DESCRIPTION

Figure 1:
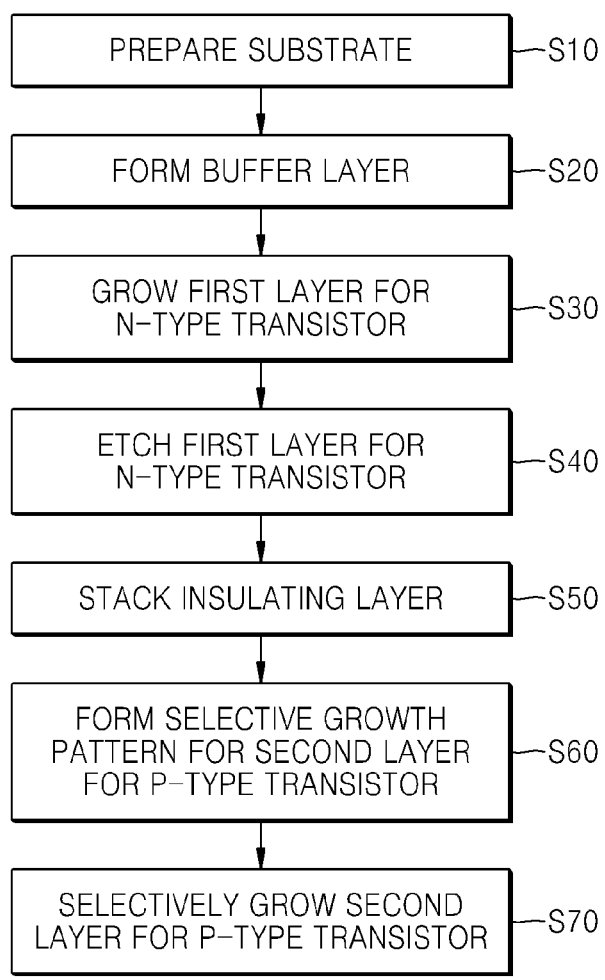
FIG. 1 is a flowchart illustrating a complementary metal oxide semiconductor (CMOS) device manufacturing method according to an example embodiment.

Hereinafter, complementary metal oxide semiconductor (CMOS) devices according to example embodiments and methods of manufacturing the same will be described in detail with reference to the accompanying drawings. In the drawings, like reference numerals denote like elements, and the sizes or thicknesses of elements are exaggerated for clarity. The embodiments described hereinafter are merely exemplary, and various changes and modifications may be made therein.

It will be understood that when an element is referred to as being "on," "connected" or "coupled" to another element, it can be directly on, connected or coupled to the other element or intervening elements may be present. In contrast, when an element is referred to as being "directly on," "directly connected" or "directly coupled" to another element, there are no intervening elements present. As used herein the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

Reference will now be made in detail to embodiments, examples of which are illustrated in the accompanying drawings, wherein like reference numerals refer to the like elements throughout. In this regard, the example embodiments may have different forms and should not be construed as being limited to the descriptions set forth herein. Accordingly, the embodiments are merely described below, by referring to the figures, to explain example embodiments of the present description.

FIG. 1 is a flowchart illustrating a CMOS device manufacturing method according to an example embodiment.

Referring to FIG. 1, according to an example embodiment, a substrate is prepared S10, and a buffer layer is formed on the substrate S20. The substrate may be a silicon-based substrate. For example, the substrate may be a silicon substrate. A first layer for an n-type transistor is grown on the buffer layer S30. For example, the n-type transistor may be an n-type metal oxide semiconductor field effect transistor (MOSFET). The first layer for the n-type transistor is etched to form a first pattern S40. The first pattern may expose a portion of the buffer layer or may expose a portion of the substrate. An insulating layer is stacked on the first layer for the n-type transistor and the first pattern S50. The insulating layer is etched to form a second pattern for selective growth S60. The second pattern may be a pattern for selectively growing a second layer for a p-type transistor.

A second layer for a p-type transistor is formed in the second pattern S70. For example, the p-type transistor may be a p-type MOSFET. The first layer for the n-type transistor may be formed of a material with high electron mobility, and the second layer for the p-type transistor may be formed of a material with high hole mobility.

The example embodiment provides a manufacturing method that may form both an n-type transistor and a p-type transistor on one substrate.

Figure 2:
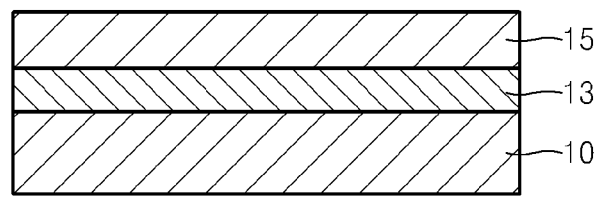
FIGS. 2 to 8 are cross-sectional views illustrating a CMOS device manufacturing method according to an example embodiment.

FIGS. 2 to 8 illustrate a CMOS device manufacturing method according to an example embodiment. Referring to FIG. 2, a buffer layer 13 may be formed on a substrate 10, and a material layer 15 for an n-type transistor may be formed on the buffer layer 13. The substrate 10 may be a silicon-based substrate. Also, the substrate 10 may be doped with a p-type or n-type dopant. For example, the substrate 10 may be a silicon substrate, and may be a p-type silicon substrate.

For example, the material layer 15 for the n-type transistor may be formed of a Group III-V material, which will be described later.

For example, the buffer layer 13 may be formed of a Group III-V material of the same series as the material layer 15. For example, the buffer layer 13 may include a Group III-V material including at least one selected from the group consisting of indium (In), gallium (Ga), and aluminum (Al), and at least one selected from the group consisting of arsenic (As), phosphorus (P), and stibium (Sb). The Group III-V material for the buffer layer 13 may be a two-element material, a three-element material, or a four-element material. For example, the two-element material may be InP, InAs, InSb, GaAs, GaP, GaSb, AlP, AlAs, or AlSb. For example, the three-element material may be InAlAs, InGaP, or GaAsP. For example, the four-element material may be InGaAsP or InGaAlAs. The buffer layer 13 may be an n-type material layer. Alternatively, the buffer layer 13 may be a layer doped with an n-type dopant, or may be a layer having an n-type doping effect. For example, the buffer layer 13 may be an n-InP layer. The buffer layer 13 may reduce the lattice constant difference and the thermal expansion coefficient difference between the substrate 10 and the material layer 15 for the n-type transistor and reduce the defects thereof to increase the crystallinity of the material layer 15 of the n-type transistor.

Alternatively, the buffer layer 13 may be formed of a material of the same series as a material for a second layer 25 for a p-type transistor, which will be described later. For example, the buffer layer 13 may be formed of at least one Group IV material. For example, the buffer layer 13 may include at least one of SiGe, GeSn, and Ge.

For example, the material layer 15 for the n-type transistor may be formed of a Group III-V material. For example, the III-V material may include at least one of InGaAs, InP, InSb, InGaSb, GaSb, and InAs. Also, the material layer 15 for the n-type transistor may have a quantum well structure. A wet treatment or in-situ annealing may be performed as a pretreatment on the material layer 15 of the n-type transistor. For example, the n-type transistor may be an n-type MOSFET.

Figure 3:
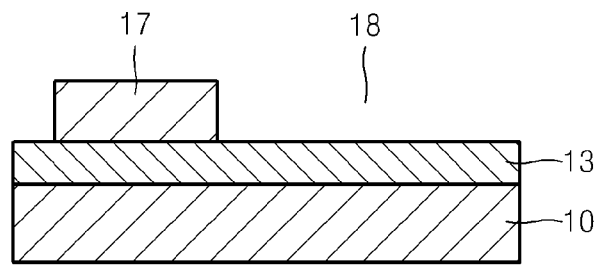

Referring to FIG. 3, according to an example embodiment, the material layer 15 for the n-type transistor may be etched to form a first layer 17 for the n-type transistor and a first pattern 18. For example, the first layer 17 may be a channel layer of the n-type transistor.

Figure 4:
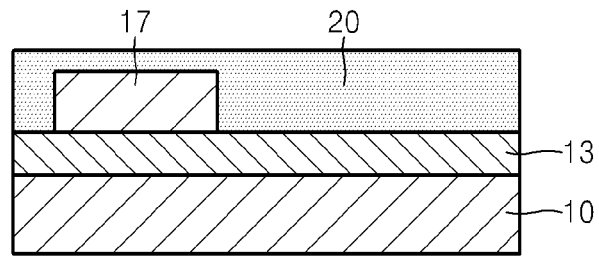
Figure 5:
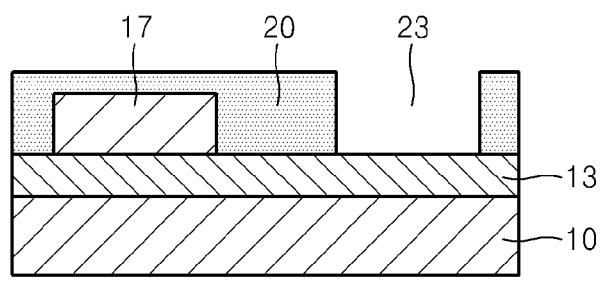
Figure 6:
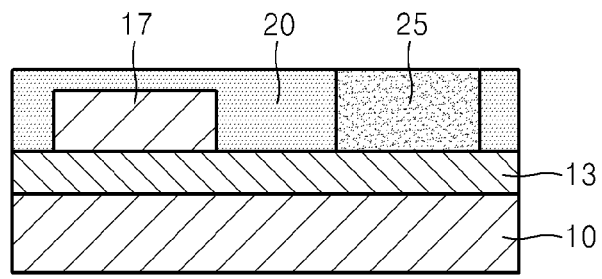

According to an example embodiment, the first pattern 18 may expose a portion of the buffer layer 13. The material layer 15 for the n-type transistor may be etched by using photoresist. Referring to FIG. 4, an insulating layer 20 may be formed on the first layer 17 for the n-type transistor and an exposed region of the buffer layer 13. The insulating layer 20 may be formed of an oxide film, a nitride film, or an oxynitride film. For example, the insulating layer 20 may be formed of a silicon oxide ($SiO_2$) film, a silicon nitride ($SiN_x$) film, or a silicon oxynitride ($SiO_xN_y$) film. Referring to FIG. 5, the insulating layer 20 may be etched to form a second pattern 23 for selective growth. Referring to FIG. 6, a second layer 25 for a p-type transistor may be formed in the second pattern 23 by selective growth. The second layer 25 may be grown to have a thickness that is smaller than, equal to, or greater than the depth of the second pattern 23. After the growth of the second layer 25, the surface of the second layer 25 may be planarized through a planarization process. For example, the planarization process may be a chemical mechanical polishing (CMP) process. Herein, the planarization process is not mandatory but may be performed selectively according to the surface state of the second layer 25. The insulating layer 20 may be used as a mask in the selective growth process. For example, the second layer 25 may be formed of a material including a Group IV material. For example, the second layer 25 may be formed of germanium (Ge). The second layer 25 may be grown by epitaxial growth. For example, the second layer 25 may be formed by growing germanium to several tens of nm at a low temperature of, for example, about 400° C., and then growing germanium at a high temperature of, for example, about 600° C. Herein, the insulating layer 20 may be used as a mask. Since the surface of the first layer 17 is covered with the insulating layer 20, the second layer 25 may be selectively grown on the exposed region of the buffer layer 13.

Figure 7:
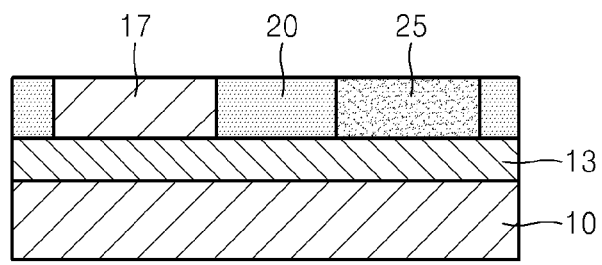

Referring to FIG. 7, according to an example embodiment, the surface of the resulting structure illustrated in FIG. 6 may be planarized to expose the first layer 17. For example, the planarization may be performed through a CMP process. Accordingly, both the first layer 17 for the n-type transistor and the second layer 25 for the p-type transistor may be formed on one substrate 10. For example, selectively growing the second layer 25 formed of a Ge material may be easier and simpler than selectively growing the first layer 17 formed of a Group III-V material.

Figure 8:
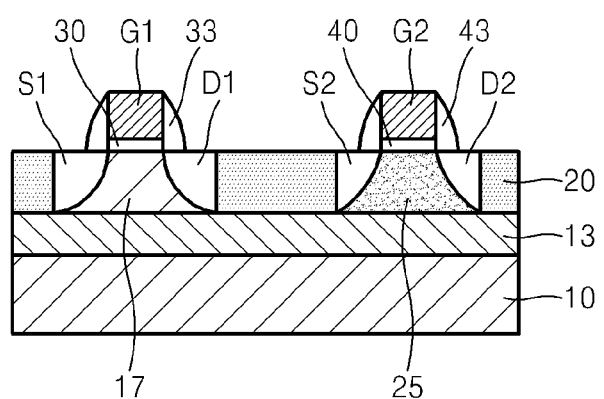

Referring to FIG. 8, according to an example embodiment, a first source electrode S1 and a first drain electrode D1 may be formed at both sides of the first layer 17. Alternatively, the first source electrode S1 and the first drain electrode D1 may be formed at a top portion of the first layer 17 while being spaced apart from each other. A second source electrode S2 and a second drain electrode D2 may be formed at both sides of the second layer 25. Alternatively, the second source electrode S2 and the second drain electrode D2 may be formed at a top portion of the second layer 25 while being spaced apart from each other. For example, the first and second source electrodes S1 and S2 and the first and second drain electrodes D1 and D2 may be formed by implantation. However, example embodiments are not limited thereto, and the source electrodes and the drain electrodes may be formed by various other methods. The first and second source electrodes S1 and S2 and the first and second drain electrodes D1 and D2 may be formed of a conductive material, for example, a metal or an alloy. For example, the first and second source electrodes S1 and S2 and the first and second drain electrodes D1 and D2 may be formed of a Ti/Au alloy or a Ge/Au/Ni/Au alloy.

According to an example embodiment, a first gate insulating layer 30 may be formed on the first layer 17, and a second gate insulating layer 40 may be formed on the second layer 25. For example, the first and second gate insulating layers 30 and 40 may include at least one of $Al_2O_3$, $SiO_x$, $Si_xN_y$, $Sc_2O_3$, AlN, $Ga_2O_3$, $Gd_2O_3$, $Al_xGa_{2(1-x)}O_3$, and MgO. However, example embodiments are not limited thereto, and the first and second gate insulating layers 30 and 40 may include any gate insulating layer material that is used in a general transistor. A first gate electrode G1 may be formed on the first gate insulating layer 30, and a second gate electrode G2 may be formed on the second gate insulating layer 40. A first spacer 33 may be formed on both sides of the first gate electrode G1. A second spacer 43 may be formed on both sides of the second gate electrode G2. The first gate electrode G1, the first source electrode S1, and the first drain electrode D1 may be formed of various metals or conductive oxide materials. Also, the first gate electrode G1, the first source electrode S1, and the first drain electrode D1 may be formed of the same material, or may be formed of different materials. The second gate electrode G2, the second source electrode S2, and the second drain electrode D2 may be formed of various metals or conductive oxide materials. Also, the second gate electrode G2, the second source electrode S2, and the second drain electrode D2 may be formed of the same material, or may be formed of different materials. Since the first and second gate insulating layers 30 and 40 have a very large energy bandgap, the first and second gate insulating layers 30 and 40 may function as barrier layers with respect to the first and second layers 17 and 25, respectively.

Referring to FIG. 7, a CMOS device according to an example embodiment includes a substrate 10, a buffer layer 13 on the substrate 10, and a first layer 17 for an n-type transistor and a second layer 25 for a p-type transistor that are disposed on the buffer layer while being spaced apart from each other. Also, an insulating layer 20 may be provided between the first layer 17 and the second layer 25. Accordingly, the CMOS device includes both the first layer 17 for the n-type transistor and the second layer 25 for the p-type transistor, on one substrate 10.

Figure 9:
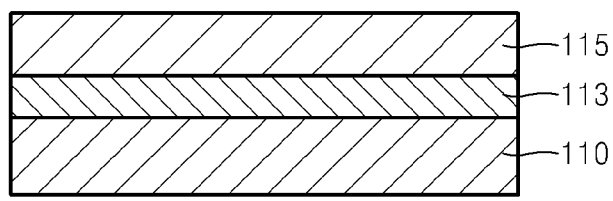
FIGS. 9 to 15 are cross-sectional views illustrating a CMOS device manufacturing method according to another example embodiment.

FIGS. 9 to 15 illustrate a CMOS device manufacturing method according to another example embodiment. Referring to FIG. 9, a buffer layer 113 may be formed on a substrate 110, and a material layer 115 for an n-type transistor may be formed on the buffer layer 113. The substrate 110 may be a silicon-based substrate. Also, the substrate 110 may be doped with a p-type or n-type dopant. For example, the substrate 110 may be a silicon substrate, and may be a p-type silicon substrate.

For example, the material layer 115 for the n-type transistor may be formed of a Group III-V material. For example, the buffer layer 113 may be formed of a Group III-V material of the same series as the material layer 115 for the n-type transistor. Since the buffer layer 113 and the material layer 115 for the n-type transistor may be formed of the same materials and may perform the same operations as the buffer layer 13 and the material layer 15 of the n-type transistor described with reference to FIGS. 2 to 8, detailed descriptions thereof will be omitted herein.

Figure 10:
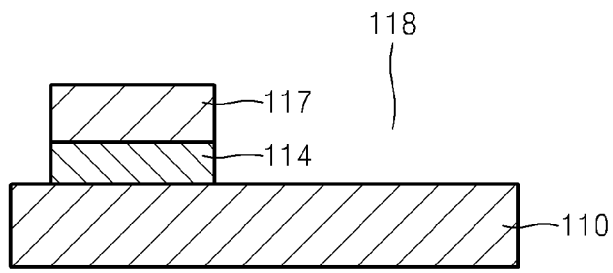
Figure 11:
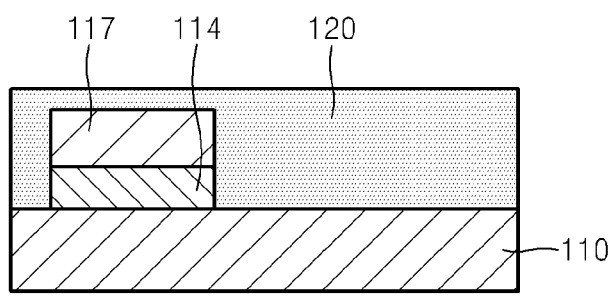

Referring to FIG. 10, according to an example embodiment, the material layer 115 for the n-type transistor may be etched to form a first layer 117 for the n-type transistor and a first pattern 118. The first pattern 118 may expose a portion of the substrate 110. Referring to FIG. 11, an insulating layer 120 may be formed on the first layer 117 for the n-type transistor and an exposed region of the buffer layer 110. The insulating layer 120 may be formed of an oxide film, a nitride film, or an oxynitride film. For example, the insulating layer 120 may be formed of a silicon oxide ($SiO_2$) film, a silicon nitride ($SiN_x$) film, or a silicon oxynitride ($SiO_xN_y$) film.

Figure 12:
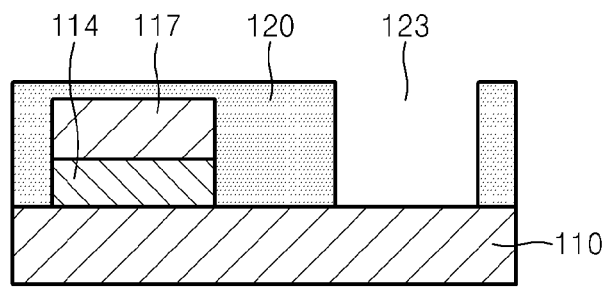
Figure 13:
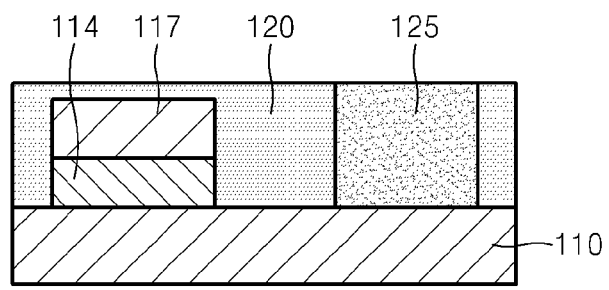

Referring to FIG. 12, according to an example embodiment, the insulating layer 120 may be etched to form a second pattern 123 for selective growth. The second pattern 123 may expose a portion of the substrate 110. Referring to FIG. 13, a second layer 125 for a p-type transistor may be formed in the second pattern 123 by selective growth. The insulating layer 120 may be used as a mask in the selective growth process. For example, the second layer 125 may be formed of a material including a Group IV material. For example, the second layer 125 may be formed of germanium (Ge). Since the surface of the first layer 117 is covered with the insulating layer 120, the second layer 125 may be selectively grown on the exposed region of the substrate 110.

Figure 14:
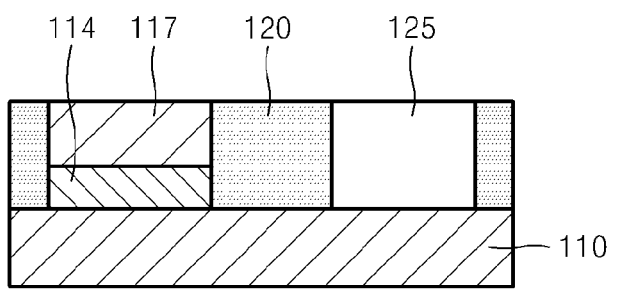

Referring to FIG. 14, according to an example embodiment, the surfaces of the first layer 117 and the second layer 125 may be planarized through a planarization process. Accordingly, both the first layer 117 for the n-type transistor and the second layer 125 for the p-type transistor may be formed on one substrate 10. For example, selectively growing the second layer 125 formed of a single material may be easier and simpler than selectively growing the first layer 117 formed of a Group III-V compound material.

Figure 15:
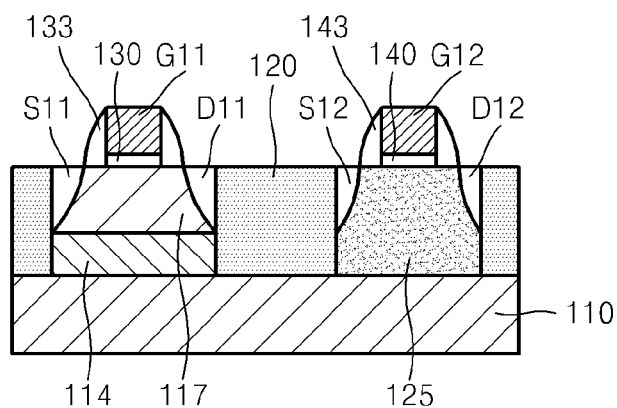

Referring to FIG. 15, according to an example embodiment, a first source electrode S11 and a first drain electrode D11 may be formed at both sides of the first layer 117. Alternatively, the first source electrode S11 and the first drain electrode D11 may be formed at a top portion of the first layer 117 while being spaced apart from each other. A second source electrode S12 and a second drain electrode D12 may be formed at both sides of the second layer 125. A first spacer 133 may be formed on both sides of a first gate electrode G11. A second spacer 143 may be formed on both sides of a second gate electrode G12. Alternatively, the second source electrode S12 and the second drain electrode D12 may be formed at a top portion of the second layer 125 while being spaced apart from each other. A first gate insulating layer 130 may be formed on the first layer 117, and the first gate electrode G11 may be formed on the first gate insulating layer 130. A second gate insulating layer 140 may be formed on the second layer 125, and the second gate electrode G12 may be formed on the second gate insulating layer 140.

Referring to FIG. 14, in a CMOS device according to another example embodiment, a buffer layer 114 may be provided on a substrate 110, a first layer 117 for an n-type transistor may be provided on the buffer layer 114, and a second layer 125 for a p-type transistor may be provided on the substrate 110 while being spaced apart from the first layer 117. Also, an insulating layer 120 may be provided between the first layer 117 and the second layer 125.

FIGS. 16 to 23 illustrate a CMOS device manufacturing method according to another example embodiment.

Figure 16:
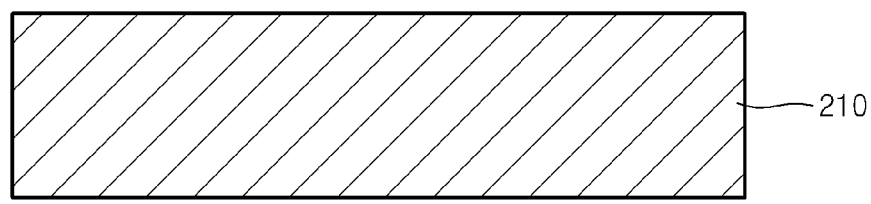
FIGS. 16 to 23 are cross-sectional views illustrating a CMOS device manufacturing method according to another example embodiment.
Figure 17:
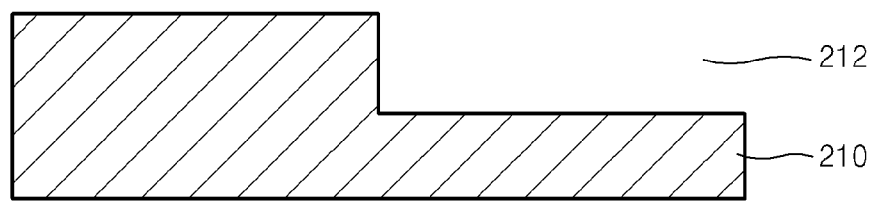
Figure 18:
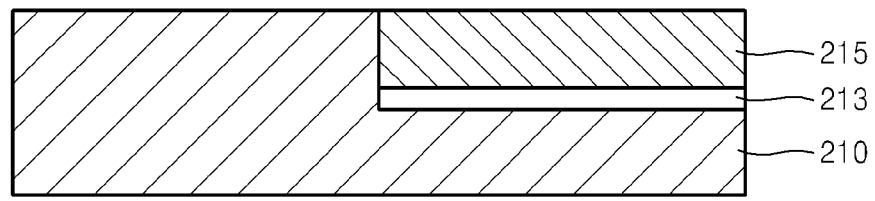
Figure 19:
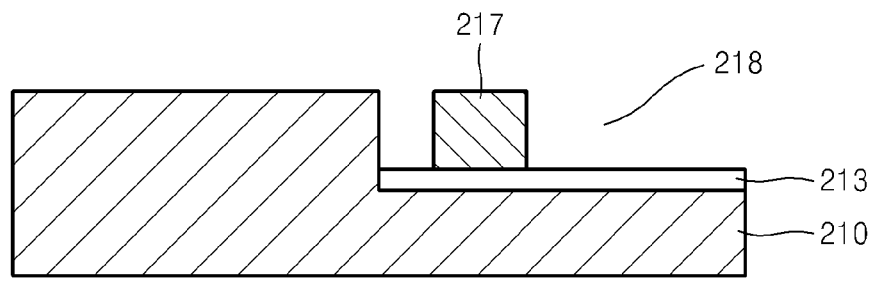

Referring to FIG. 16, according to an example embodiment, a substrate 210 is prepared. Referring to FIG. 17, the substrate 210 is etched to form a first pattern 212. Referring to FIG. 18, a buffer layer 213 and a material layer 215 for an n-type transistor are formed in the first pattern 212. Referring to FIG. 19, the material layer 215 for the n-type transistor is etched to form a first layer 217 for the n-type transistor and a second pattern 218. The second pattern 218 may be formed to expose the buffer layer 213 or to expose the substrate 210. FIG. 19 illustrates an example in which the buffer layer 213 is exposed.

Figure 20:
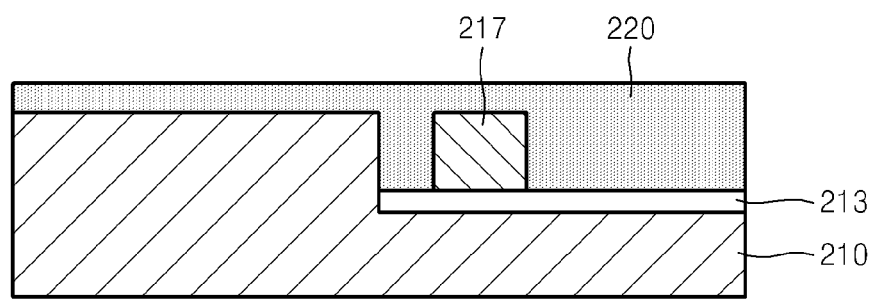
Figure 21:
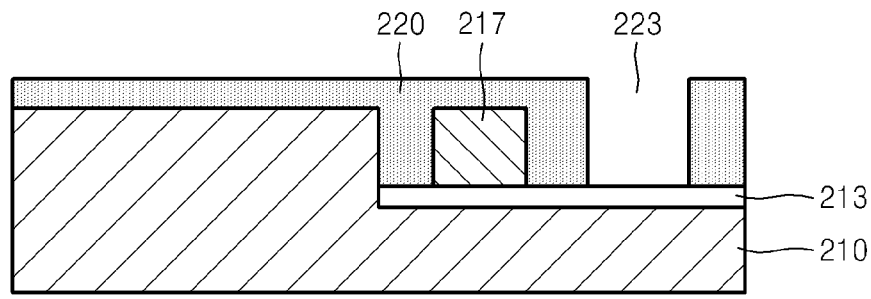
Figure 22:
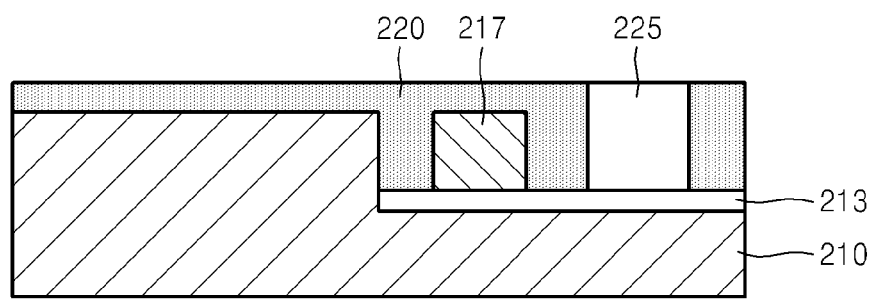
Figure 23:
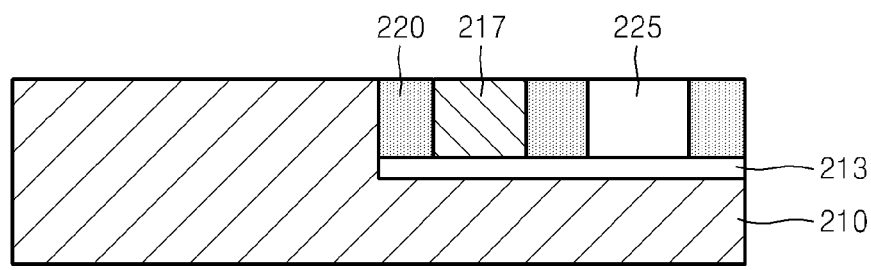

Referring to FIG. 20, according to an example embodiment, an insulating layer 220 is formed on the resulting structure illustrated in FIG. 19. Referring to FIG. 21, the insulating layer 220 may be etched to form a third pattern 223. The third pattern 223 may be a pattern for selective growth. Referring to FIG. 22, a second layer 225 for a p-type transistor may be selectively grown in the third pattern 223. The insulating layer 220 may be used as a mask in the selective growth. Referring to FIG. 23, the surfaces of the substrate 210, the first layer 217, and the second layer 225 may be planarized through a planarization process. Since the components using the same denotations as the components described with reference to FIGS. 2 and 8 may be formed of the same materials and may perform the same functions and operations as the corresponding components of FIGS. 2 and 8, detailed description thereof will be omitted herein.

Figure 24:
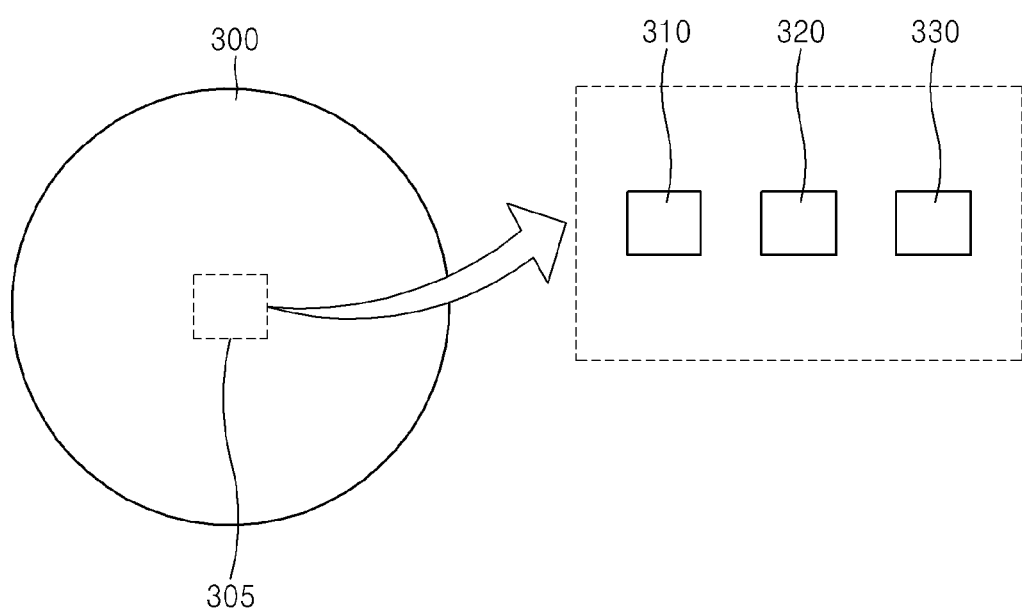
FIG. 24 is a diagram illustrating an example in which a CMOS device according to an example embodiment is provided on a wafer.

Through the above process, a plurality of hetero-junction epitaxial structures may be included in one cell of a wafer, according to an example embodiment. FIG. 24 illustrates an example in which a first region 310, a second region 320, and a third region 330 are included in one cell 305 of a wafer 300. For example, the first region 310 may be a silicon region 310, the second region 320 may be a Group III-V compound region, and the third region 330 may be a Ge region. For example, a photonic device may be provided in the first region 310, an n-type transistor may be provided in the second region 320, and a p-type transistor may be provided in the third region 330. For example, the photonic device may be a light emitting diode (LED), a laser diode (LD), or a photodiode (PD). For example, the n-type transistor and the p-type transistor may operate as an electronic device that supports a light-emitting or light-receiving operation of the photonic device. Also, in this way, photonic device integration and hybrid electronic and photonic circuit integration may be possible.

It should be understood that the exemplary embodiments described herein should be considered in a descriptive sense only and not for purposes of limitation. Descriptions of features or example embodiments within each embodiment should typically be considered as available for other similar features or example embodiments.

While one or more example embodiments have been described with reference to the figures, it will be understood by those of ordinary skill in the art that various changes in form and details may be made therein without departing from the spirit and scope of the example embodiments as defined by the following claims.

What is claimed is:

1. A method of manufacturing a complementary metal oxide semiconductor (CMOS) device, the method comprising: forming a buffer layer directly on a silicon substrate, the buffer layer including at least one of a Group IV and a Group III-V material; forming a material layer for an n-type transistor on the buffer layer; etching the material layer for the n-type transistor to form a first layer for the n-type transistor and a first pattern; forming an insulating layer on the first layer and the first pattern; etching the insulating layer to form a second pattern for selective growth, the second pattern exposing the buffer layer; selectively growing a second layer for a p-type transistor in the second pattern, the second layer contacting the buffer layer; and planarizing the second layer and the insulating layer to expose the first layer; wherein the first layer is isolated from the second layer by the insulating layer.

2. The method of claim 1, wherein the buffer layer is formed of at least one of indium (In), gallium (Ga), and aluminum (Al), and at least one of arsenic (As), phosphorus (P), and stibium (Sb).

3. The method of claim 2, wherein the buffer layer is formed of at least one of InP, InAs, InSb, GaAs, GaP, GaSb, AlP, AlAs, AlSb, InAlAs, InGaP, GaAsP, InGaAsP, and InGaAlAs.

4. The method of claim 2, wherein the buffer layer is doped with an n-type dopant.

5. The method of claim 1, wherein the buffer layer is formed of at least one of SiGe, GeSn, and germanium (Ge).

6. The method of claim 1, wherein the first layer is formed of a Group III-V material.

7. The method of claim 1, wherein the first layer is formed of at least one of InGaAs, InP, InSb, InGaSb, GaSb, and InAs.

8. The method of claim 1, wherein the second layer is formed of a Group IV material.

9. The method of claim 8, wherein the second layer is formed of Ge.

10. The method of claim 1, wherein the n-type transistor comprises an n-type metal oxide semiconductor field effect transistor (MOSFET).

11. The method of claim 1, wherein the p-type transistor comprises a p-type MOSFET.

12. The method of claim 1, wherein the first layer and the second layer are channel layers.

13. The method of claim 1, wherein the forming the first pattern includes etching the material layer to expose a portion of the buffer layer.

14. The method of claim 1, wherein the insulating layer is formed of a silicon oxide film, a silicon nitride film, or a silicon oxynitride film.

15. A method of manufacturing a complementary metal oxide semiconductor (CMOS) device, the method comprising: forming a buffer layer directly on a substrate, the buffer layer including at least one of a Group IV and a Group III-V material; forming a first material layer on the buffer layer, the first material layer including a group III-V material; etching the first material layer and the buffer layer to form a first layer and a first pattern, the first pattern exposing the substrate; forming an insulating layer on the first layer and the first pattern; etching the insulating layer to form a second pattern, the second pattern exposing the substrate; selectively growing a second material layer in the second pattern, the second material layer including a group IV material; and planarizing the second layer and the insulating layer to expose the first layer; wherein the first layer is isolated from the second layer by the insulating layer.

16. The method of claim 15, wherein:
the first material layer includes at least one of InGaAs, InP, InGaSb, GaSb, InAs, GaAs, and InSb; and
the second material layer includes Ge.

17. The method of claim 15, wherein selectively growing the second material layer comprises growing the second material layer on the buffer layer.

* * * * *